United States Patent [19]

Atarashi et al.

[11] Patent Number: 5,504,651
[45] Date of Patent: Apr. 2, 1996

[54] COOLING APPARATUS FOR ELECTRONIC EQUIPMENT

[75] Inventors: Takayuki Atarashi; Toshio Hatada, both of Tsuchiura; Tetsuya Tanaka, Niihari; Toshiki Iino, Inashiki; Kenichi Kasai, Hadano; Takahiro Daikoku, Ushiku; Tamotsu Tsukaguchi, Hiratsuka, all of Japan

[73] Assignee: Hitachi Chemical Co., Ltd., Tokyo, Japan

[21] Appl. No.: 220,256

[22] Filed: Mar. 30, 1994

[30] Foreign Application Priority Data

Mar. 31, 1993 [JP] Japan ..................... 5-073083

[51] Int. Cl.$^6$ .......................................... H05K 7/20
[52] U.S. Cl. ................ 361/700; 62/259.2; 165/104.33; 257/722; 361/719; 361/784
[58] Field of Search ........................ 62/414, 418, 259.2; 174/16.3; 165/80.3, 80.4, 104.33, 122, 126; 257/707, 706, 713, 714, 721, 722–724; 361/784, 790, 689, 690, 691, 692, 694, 695, 697, 699, 700, 703, 717–719

[56] References Cited

U.S. PATENT DOCUMENTS

| | | | |
|---|---|---|---|
| 4,498,118 | 2/1985 | Bell | 361/691 |
| 4,520,424 | 5/1985 | Carpenter | 361/383 |
| 4,777,560 | 10/1988 | Herrell | 361/384 |
| 4,835,658 | 5/1989 | Bonnefoy | 361/719 |
| 4,872,088 | 10/1989 | Hawkins | 361/384 |
| 5,245,508 | 9/1993 | Mizzi | 361/784 |

FOREIGN PATENT DOCUMENTS

| | | |
|---|---|---|
| 0445309 | 9/1991 | European Pat. Off. . |
| 4333373 | 9/1993 | Germany . |
| 1-73993 | 5/1989 | Japan . |
| 2-034993 | 2/1990 | Japan . |
| 4-162497 | 10/1990 | Japan . |
| 3-011759 | 1/1991 | Japan . |

*Primary Examiner*—Gerald P. Tolin
*Attorney, Agent, or Firm*—Antonelli, Terry, Stout & Kraus

[57] ABSTRACT

An electronic equipment has a cooling structure in which air discharged from heat sinks can be recovered without any leakage and compact blow ducts and discharge ducts are disposed in a narrow space. A supply opening and a discharge opening for cooling air are independently formed in a heat sink. A plurality of supply branched ducts and discharge branched ducts are combined in a comb-like shape along the axis of the ducts. Ejection openings for cooling air are formed on each of the supply branched ducts in positions corresponding to each of the heat sinks. Such ejection openings are closely connected to the supply openings for cooling air of the heat sinks. On the other hand, recovery openings for cooling air are formed on each of the refrigerant discharge ducts in a position corresponding to each of the heat sinks. Such recovery openings are closely connected to the discharge openings for gas refrigerant of the heat sinks.

10 Claims, 8 Drawing Sheets

COOLING APPARATUS FOR ELECTRONIC EQUIPMENT

BACKGROUND OF THE INVENTION

1. Field of the Invention

The present invention relates to an electronic equipment having a plurality of heat-emitting semiconductor parts in which a refrigerant such as air, or the like, flows to cool the semiconductor parts by means of heat sinks. More particularly, the invention relates to an electronic equipment having the feature of the cooling structure, such as the heat sinks.

2. Description of the Related Art

Conventionally, the following system is often employed in an electronic equipment as a means of cooling a plurality of heat-emitting semiconductor parts mounted on a circuit substrate such as a printed substrate, a ceramic substrate, or the like. A fin is mounted on each of the heat-emitting semiconductor parts, thereby supplying cooling air to the sides of the semiconductor parts which are then sequentially cooled. However, since the amount of heat emitted from the semiconductor parts continues to significantly increase, the above system presents a new problem in that the air temperature thus soars, and accordingly, in the further the position of the equipment in the downstream direction of the air, the more the cooling performance deteriorates. Thus, in order to solve the above problem, the following method has been proposed. A fin is mounted on each of the heat-emitting semiconductor parts and the cooling air supplied from a blower is blown into each of the fins through a plenum and a nozzle, or the like, disposed on each of the fins. Then, the air which has been made warm in each of the fins is recovered in a discharge duct and then discharged therefrom. Such a method is disclosed in, for example, Japanese Utility Model Unexamined Publication No. 1-73993. A cooling equipment of such a conventional electronic equipment will be described with reference to FIG. 13.

A plurality of heat-emitting LSIs 102 are mounted on a substrate 101. A heat sink 103 is further disposed on each of the LSIs 102. The cooling air is then supplied to each of the LSIs 102 from an inlet opening 106, through a blow duct 104 and an ejection opening 105, thereby cooling the LSIs 102. After cooling the LSIs 102, the cooling air stream is inverted in each of the heat sinks 103 and drawn into by a fan from into feedback openings 108 provided for discharge ducts 107 so as to be discharged via outlet opening 10 to the exterior of the equipment.

The ejection openings 105 and the feedback openings 108 are separated from the heat sinks 103. Further, the discharge ducts 107 and the flow ducts 104 are mounted on the heat sinks 103 in two stages.

In the above conventional electronic equipment, when the amount of heat emitted from the semiconductor parts and the mounting density thereof are relatively small, all the cooling air can be substantially transferred to the heat sinks without any leakage, and all the air discharged from the heat sinks can be substantially recovered from the feedback openings and discharged to the exterior of the equipment. However, recently, the processing speed of electronic equipment has become higher and the density thereof has become larger, thereby increasing the amount of heat emitted from the semiconductor parts and the mounting density thereof and further increasing the air flow rate, thus raising the ejection pressure thereof and the discharge pressure from the heat sinks. Hence, the air discharged from the heat sinks may be leaked from a gap between each of the heat sinks and the feedback openings, thus making it difficult to recover the discharge air from the feedback openings without any leakage. It makes the matter worse that the unrecovered air is warm and thus increases the temperature of the other semiconductor parts or makes the air stream complicated, thereby increasing the flow loss and thus hampering efficient air cooling performed on the electronic equipment.

Moreover, in the conventional electronic equipment, the discharge ducts are disposed on the top of the heat sinks provided for the semiconductor parts mounted on the substrate, and the blow ducts are further disposed on the top of discharge ducts. When the electronic equipment is constructed as described above, a considerably large space is required on top of the heat sinks. There is no problem when the semiconductor chips are arranged in a plane having a sufficiently large space on top of the heat sinks. However, when a plurality of substrates are three-dimensionally disposed closely parallel to each other, a sufficiently large space cannot be provided on top of the heat sinks, thus making it difficult to arrange the ducts constructed as described above.

SUMMARY OF THE INVENTION

Accordingly, in view of the above problems inherent in the related art, a first object of the present invention is to provide a cooling structure which is capable of recovering air discharged from heat sinks without any leakage even when the heat emitted from semiconductor parts and the mounting density thereof are increased and accordingly, the flow rate, ejection pressure and discharge pressure of air are increased.

A second object of the present invention is to provide a cooling structure which is capable of providing compact blow ducts and discharge ducts in a narrow space when a large space for ducts cannot be ensured in the case where a plurality of substrates are disposed closely parallel to each other three-dimensionally.

In order to achieve the first object, according to the present invention an electronic equipment is provided by constructing, a heat sink thermally connected to each of semiconductor parts and mounted thereon, the heat sink having a supply opening and a discharge and including a supply of branched duct for supply the gas refrigerant to the heat sink opening. The supply branched ducts are disposed on the extension along the arrangement of the heat-emitting semiconductor equipments. Each of the supply branched ducts includes ejection openings for the gas refrigerant in a position corresponding to each of the heat sinks. Such ejection openings are closely connected to the supply openings of the heat sinks. Then, the discharge branched ducts for recovering the refrigerant discharged from the heat sinks and discharging it to the exterior of the equipment are disposed on the extension along the arrangement of the semiconductor parts. Further, each of the discharge branched ducts has recovery openings in a position corresponding to each of the heat sinks. Such recovery openings are closely connected to the discharge openings of the heat sinks.

In order to achieve the second object, the present invention provides an electronic equipment in which the refrigerant supply branched ducts and refrigerant discharge branched ducts are alternately disposed in the same plane substantially parallel to the substrates along gaps between heat-emitting semiconductor parts.

Also, the refrigerant supply branched ducts may supply a refrigerant to two or more heat sinks in a cross section vertically taken along the axis of the ducts.

Moreover, the refrigerant discharge branched ducts may recover a refrigerant from two or more heat sinks in a cross section vertically taken along the axis of the ducts.

Further, the height of the heat sinks may become smaller toward the end thereof so that the refrigerant supply branched ducts and discharge branched ducts are alternately disposed to fill in the gaps between the adjacent heat sinks.

The present invention also provides an electronic equipment in which a plurality of heat-emitting semiconductor parts are mounted on both surfaces of a substrate and a plurality of substrates are stacked substantially parallel to each other, wherein a quadrilateral portion is formed by two of the adjacent semiconductor parts mounted on one surface of the substrate and another two of the adjacent semiconductor parts mounted on another substrate facing the surface of the former substrate in the position facing the former semiconductor parts, a refrigerant supply branched duct for simultaneously supplying a gas refrigerant to the four semiconductor parts being disposed in the quadrilateral portion.

The present invention further provides an electronic equipment in which a plurality of heat-emitting semiconductor parts are mounted on both surfaces of a substrate and a plurality of substrates are stacked substantially parallel to each other, wherein a quadrilateral portion is formed by two of the adjacent semiconductor parts mounted on one surface of the substrate and another two of the adjacent semiconductor parts mounted on another substrate facing the surface of the former substrate in the position facing the former semiconductor parts, a refrigerant discharge branched duct for simultaneously recovering a gas refrigerant from the four semiconductor parts being disposed in the quadrilateral portion.

Also, the sectional area vertically taken along the axis of the refrigerant supply ducts may be made smaller toward the downstream direction in which the refrigerant flows.

Further, the sectional area vertically taken along the axis of the refrigerant discharge ducts may be made larger toward the downstream direction in which the refrigerant flows.

According to the above construction of the present invention, the following advantages can be obtained.

Even when the amount of heat emitted from the semiconductor parts and the mounting density thereof are greater, and accordingly, the air flow rate for cooling the semiconductor parts and the ejection pressure are increased, the air ejection openings of the refrigerant supply branched ducts are closely connected to the supply openings of the heat sinks, thus supplying the air to the heat sinks without any leakage. On the other hand, the air recovery openings of the refrigerant discharge branched ducts are adjacent to the discharge openings of the heat sinks, thus recovering the discharge air from the heat sinks without any leakage and further discharging it to the exterior of the equipment. Consequently, the cooling air can be employed for heat exchange without any waste, and also the warming of the cooling air due to such leakage is prevented, thus avoiding an increase in the temperature of other semiconductor parts and further enabling uniform and highly-efficient air cooling. Also, a complicated air stream due to air leakage is not produced, thereby smoothly enhancing efficient air flowing and reducing a flow loss.

Also, the refrigerant supply branched ducts and discharge branched ducts are alternately arranged on the same surface parallel to the substrates, thereby forming a compact duct system perpendicular to the substrates. Thus, even when a plurality of substrates are disposed closely parallel to each other three-dimensionally, a compact and efficient cooling structure can be realized.

Further, when the branched ducts are formed, the refrigerant supply branched ducts are capable of simultaneously supplying the air to a plurality of heat sinks in a cross section vertically taken along the axis of the ducts in the air-flowing direction. On the other hand, the refrigerant discharge branched ducts are capable of simultaneously recovering the air from the plurality of heat sinks. As a result, the electronic equipment of the present invention can be constructed more simply and also the flow loss can be reduced more than an equipment in which each of the sets of refrigerant supply and discharge ducts is only allocated to one heat sink.

Even when there is almost no space for disposing the refrigerant supply and discharge branched ducts above the heat sinks provided with the semiconductor parts mounted on the substrate, both ducts can be alternately disposed in the gaps between the adjacent heat sinks. Consequently, even when a plurality of substrates are very closely parallel to each other three-dimensionally, the air cooling can be realized in high efficiency.

Moreover, even when a plurality of substrates having mounted on both surfaces thereof the semiconductor parts are disposed very closely parallel to each other, both ducts can be alternately arranged in a rhombic space surrounded by the four heat sinks adjacent to each other, thus enabling the air cooling in high efficiency.

Still further, the sectional area taken along the axis of the ducts are changed, thereby achieving the uniform air flow velocity in the refrigerant supply branched ducts or the refrigerant discharge branched ducts, thus further reducing the pressure loss and enabling the uniform distribution of the flow rate into the respective heat sinks.

DESCRIPTION OF THE PREFERRED EMBODIMENTS

The present invention will now be described with reference to FIGS. 1–11.

Figure 1:
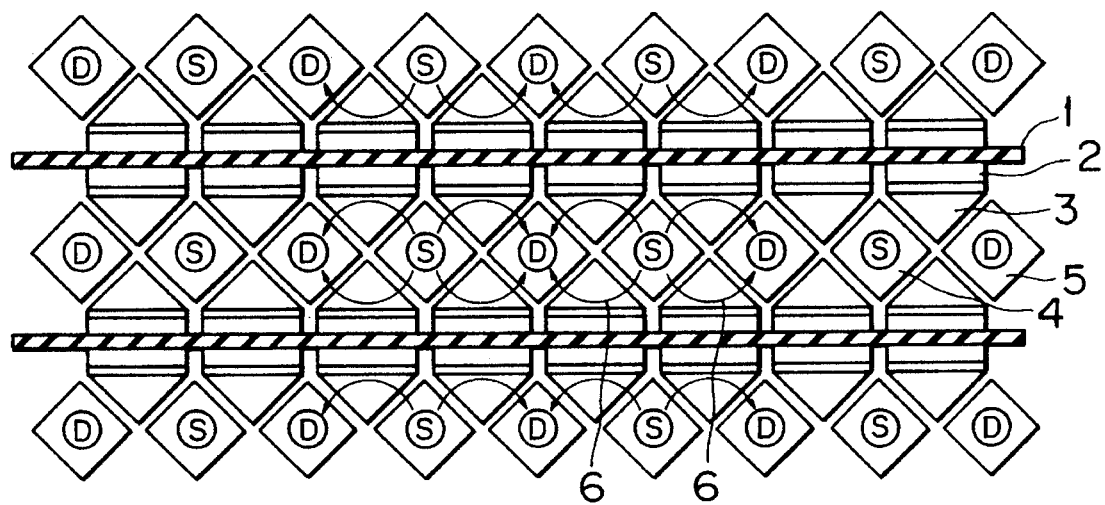
FIG. 1 is a sectional view of an electronic equipment according to a first embodiment of the present invention as viewed from the bottom to the top of the equipment.
Figure 2:
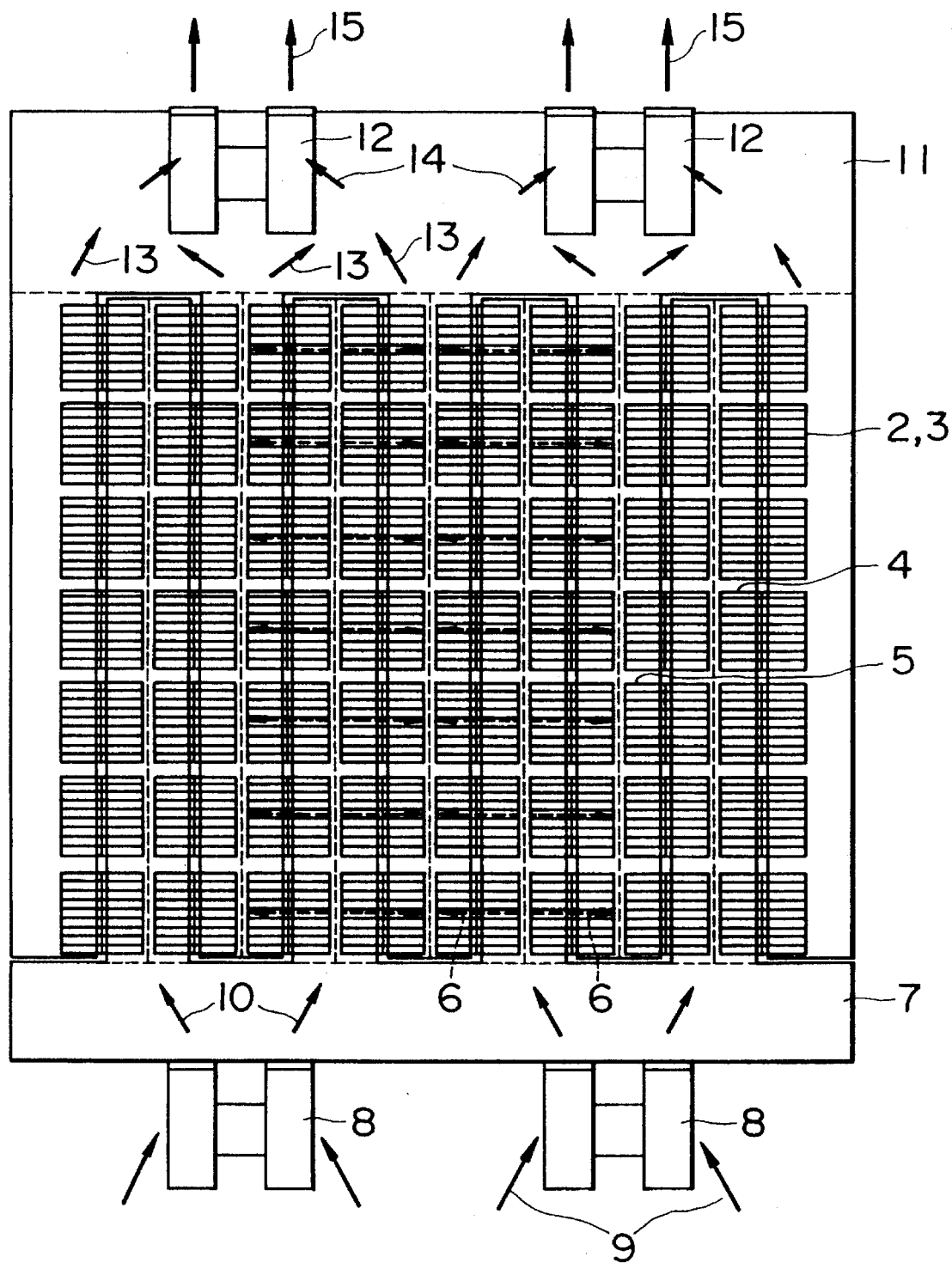
FIG. 2 is a sectional view of the electronic equipment of the first embodiment as viewed from the side of the equipment.

A first embodiment of an electronic equipment according to the present invention is shown in FIGS. 1–6. FIG. 1 is a sectional view of the electronic equipment of this embodiment as viewed from the bottom to the top of the equipment. FIG. 2 is a sectional view of the electronic equipment of this embodiment as viewed from the side of the equipment. Referring to FIG. 1, a plurality of heat-emitting semiconductor parts 2 representative of electronic circuit modules, LSIs, or the like, are arranged close to each other on both surfaces of each of substrates 1, such as printed wiring substrates or ceramic substrates. The plurality of substrates 1 are disposed parallel to each other at predetermined spacing to be three-dimensionally mounted thereon. A heat sink 3 is mounted on each of the heat-emitting semiconductor parts 2 to effectively conduct the heat emitted from each of the semiconductor parts 2 to cooling air. Each of the heat sinks 3 is constructed in the form of a fin, for example, a plane-parallel plate fin, pin fin, fibrous fin, corrugate fin, or in the form of a heat pipe or a thermo-syphon including a built-in operation fluid for transferring heat by utilizing the transformation of phases. Further, each heat sink 3 is shaped such that its width is narrower toward the top (the triangular shape in FIG. 1). Further, an air supply opening and a discharge opening are formed in the heat sink 3 independently of each other. It is desirable that the heat sink 3 be formed of a material having good heat conductivity, such as copper, aluminium, or highly heat-conductive ceramic. The heat-emitting semiconductor parts 2 and the heat sinks 3 are each constructed to thermally contact each other via a heat-conductive grease, a heat-conductive sheet or a heat-conductive adhesive, or to simply contact by pressing against each other by means of a screw. A gap between two of the adjacent heat sinks 3 on the same substrate 1 and another gap between two of the adjacent heat sinks 3 on the facing substrate form a rhombic space. Air supply branched ducts 4 and air discharge branched ducts 5 having the same rhombic cross sections are alternately disposed to be accommodated in such rhombic spaces.

Referring to FIG. 2, the supply branched ducts 4 and the discharge branched ducts 5 are extended from a supply chamber 7 and a discharge chamber 11, respectively, in a comb-like form in such a way that the comb teeth are engaged with each other. Supply blowers 8 for supplying cooling air are connected to the supply chamber 7, and discharge blowers 12 for discharging the discharge air are connected to the discharge chamber 11. The cooling air in the form of an air stream 9 is drawn into each of the supply blowers 8 from the exterior of a casing of the electronic equipment and pressurized therein so as to be fed into the supply chamber 7. The cooling air in the form of an air stream 10 is then split into the respective supply branched ducts 4 in which part of the air in the form of an air stream 6 flows into four of the heat sinks 3, two each on the right and left sides, and the rest of the air flows upward. This operation is repeated in the respective air flowing directions. On the other hand, the cooling air in the discharge branched ducts 5 flows upwardly while recovering the discharged air from the above four heat sinks 3. It is fed into the discharge chamber 11 in the form of an air stream 13 and drawn into each of the discharge blowers 12 in the form of an air stream 14 so as to be finally discharged to the exterior of the casing of the electronic equipment in the form of discharged air 15.

Figure 3:
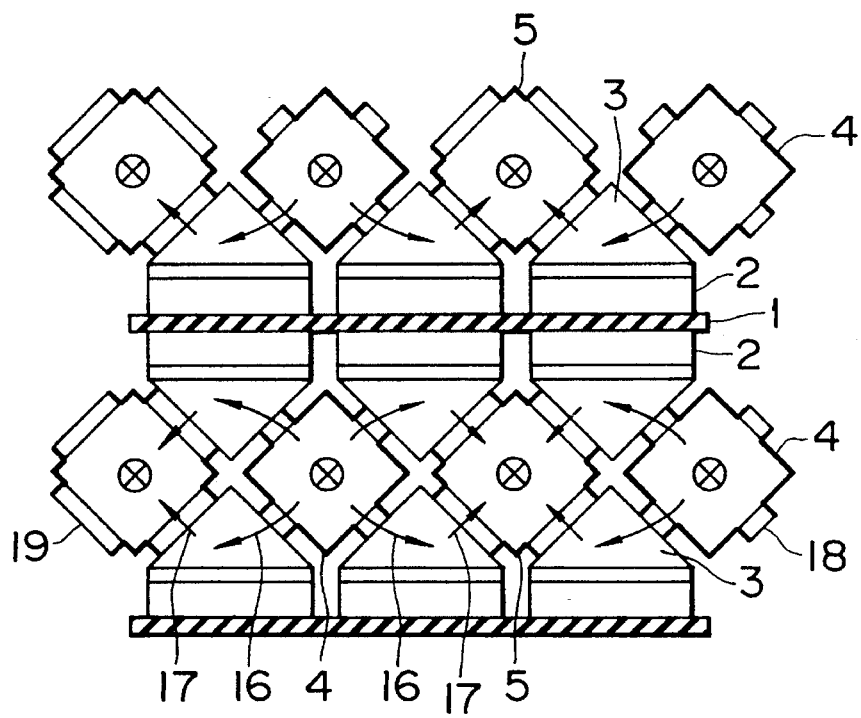
FIG. 3 is a detailed sectional view of the electronic equipment of the first embodiment as viewed from the bottom to the top of the equipment.
Figure 4:
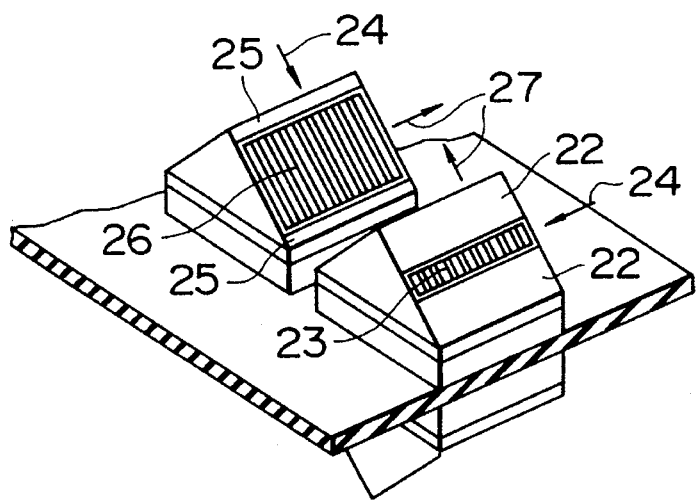
FIG. 4 is a detailed perspective view of heat sinks of the first embodiment.
Figure 5:
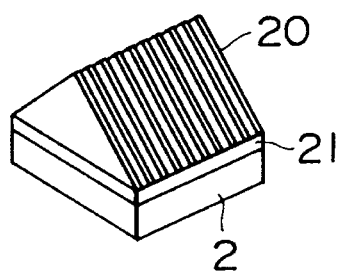
FIG. 5 is a further detailed perspective view of the heat sink of the first embodiment.

FIG. 3 is a detailed sectional view of the electronic equipment of the embodiment shown in FIG. 1 as viewed from the bottom to the top of the equipment. FIG. 4 is a detailed perspective view of the heat sinks 3. As shown in FIG. 3, four ejection openings 18 and four recovery openings 19 are provided for the air supply branched duct 4 and the air discharge branched duct 5, respectively. Each of the widths of the ejection openings 18 may be narrowed in order to supply a high-speed air jet 16 into the heat sinks 3, thereby increasing heat conductivity due to the air jet and thus improving cooling performance. Each of the heat sinks 3 is provided with, for example, a row of triangular flat plate fins 20 and a base plate 21, as illustrated in FIG. 5. As shown in FIG. 4, an air supply opening 23 is formed on the end surface adjacent to the air supply branched duct of each of the heat sinks 3 by two covering plates 22. The supply opening 23 and the ejection opening 18 of each of the air supply branched ducts 4 are closely connected to each other in order to avoid leakage of the cooling air.

Likewise, an air discharge opening 26 is formed on the end surface adjacent to the air discharge branched duct of each of the heat sinks 3 by two covering plates 25. The discharge opening 26 and the recovery opening 19 of each of the air discharge branched ducts 5 are closely connected to each other so that discharge gas 17 from the heat sink 3 can be recovered without any leakage.

Figure 6:
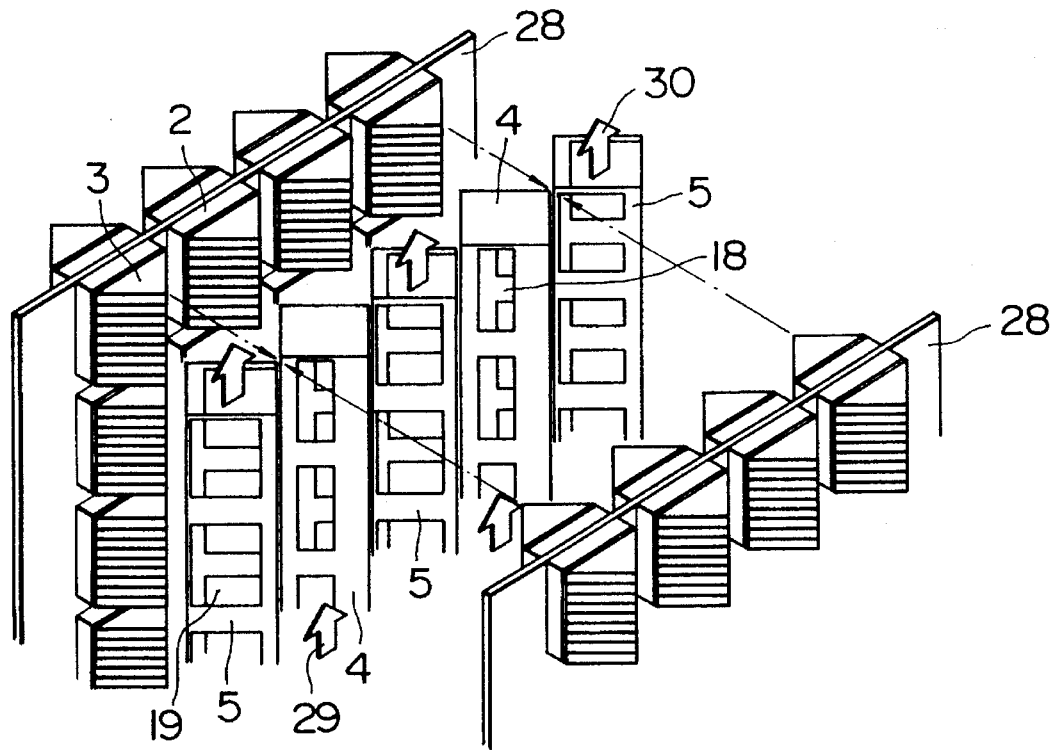
FIGS. 6 and 7 are perspective views of the first embodiment being assembled.
Figure 7:
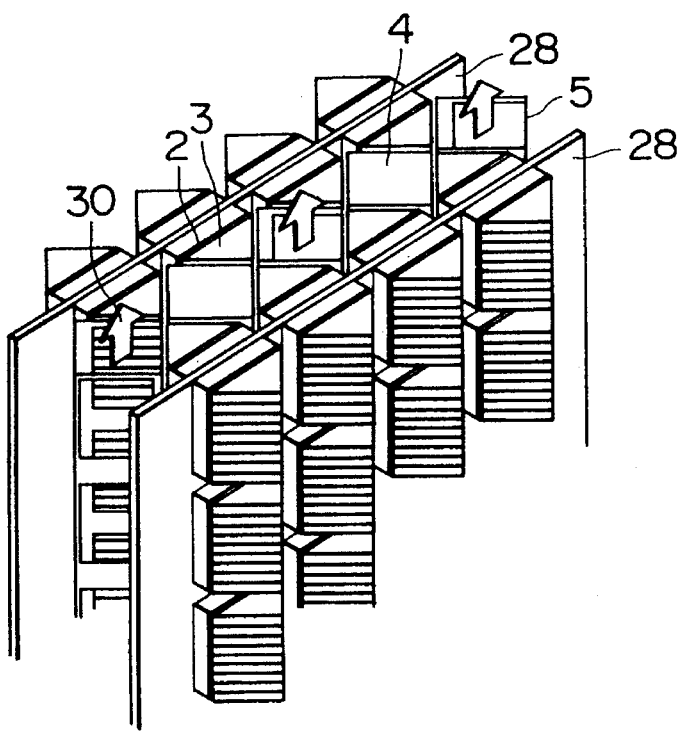

FIGS. 6 and 7 are perspective views of the electronic equipment of the embodiment shown in FIG. 1 for illustrating the manner of assembling the equipment. As illustrated in FIG. 6, the semiconductor parts 2, each having mounted thereon a heat sink 3, are mounted on both surfaces of the mounting substrates 28 in a grid-like form. The air supply branched ducts 4 and the air discharge branched ducts 5 are alternately disposed between the surfaces of the mounting substrates 28. As shown in FIG. 7, two of the mounting substrates 28 are combined in order to closely connect the air supply branched ducts 4 with the heat sinks 3 and the air discharge branched ducts 5 therewith. When three or more of the mounting substrates 28 are provided parallel to each other, the electronic equipment can also be similarly assembled.

In this embodiment, since the air recovery openings of the refrigerant discharge ducts and the air discharge openings of the heat sinks 3 are closely connected to each other, the discharged air from the heat sinks 3 can be recovered without any leakage and discharged to the exterior of the equipment. Consequently, the cooling air can be employed for heat exchange without any waste, and also warming of the cooling air due to such leakage is prevented, thus avoiding an increase in the temperature of other semiconductor parts, and further enabling uniform and highly-efficient air cooling. Also, a complicated air stream due to air leakage is not produced, thereby enhancing smoothly air flowing and reducing flow loss.

Moreover, even if there is almost no space for accommodating the supply branched ducts 4 and the discharge branched ducts 5 above the heat sinks 3 provided for the semiconductor parts mounted on the substrate 1, both ducts can be disposed alternately in the gaps between the heat sinks 3. Hence, even-when a plurality of substrates 1 are provided very closely parallel to each other three-dimensionally, the air cooling can be realized in high efficiency.

Further, the supply branched duct 4 is capable of simultaneously supplying the air to a plurality of heat sinks 3 in a cross section vertically taken along the axis of the duct, and the discharge branched duct 5 is capable of simultaneously recovering the air from the plurality of heat sinks 3. As a result, the electronic equipment of the present invention can be constructed more simply, and also the flow loss can be reduced more than on equipment in which each of the sets of supply and discharge ducts is allocated to only one heat sink.

Figure 8:
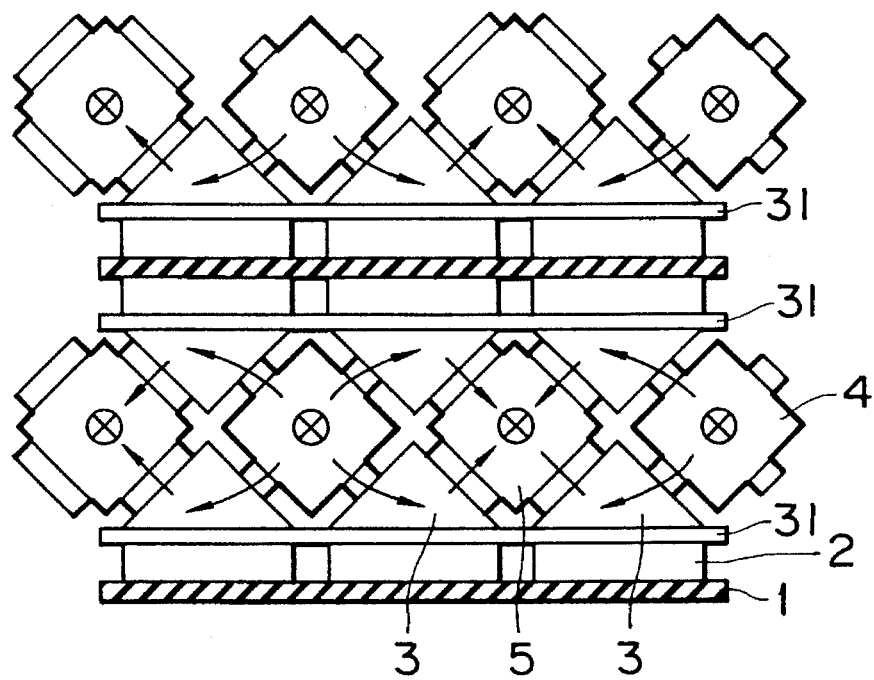
FIG. 8 is a detailed sectional view of an electronic equipment according to a second embodiment of the present invention as viewed from the bottom to the top of the equipment.

A second embodiment of the electronic equipment will now be described with reference to FIG. 8. FIG. 8 is a detailed sectional view of the electronic equipment of this embodiment as viewed from the bottom to the top of the equipment. In this embodiment, a base plate for a plurality of heat sinks 3 is commonly used. Each of the common base plates 31 is thermally brought into contact with a plurality of semiconductor parts 2 and mounted thereon. The heat sinks 3 are each disposed on the top surface of the common plate 31 in a position corresponding to one of the semiconductor parts 2. Thus, the plurality of heat sinks 3 can be replaced by a single part, thereby reducing the number of parts and further enabling a reduction in cost and the number of assembly processes. Although each of the heat sinks 3 is disposed in a position corresponding to one of the semiconductor parts 2 in this embodiment, the heat sinks 3 are not restricted to this position in this embodiment. Also, according to the amount of heat of the equipment and the space thereof, a plurality of heat sinks may be provided for one semiconductor part, or conversely, a plurality of semiconductor parts may be provided with one heat sink.

Figure 9:
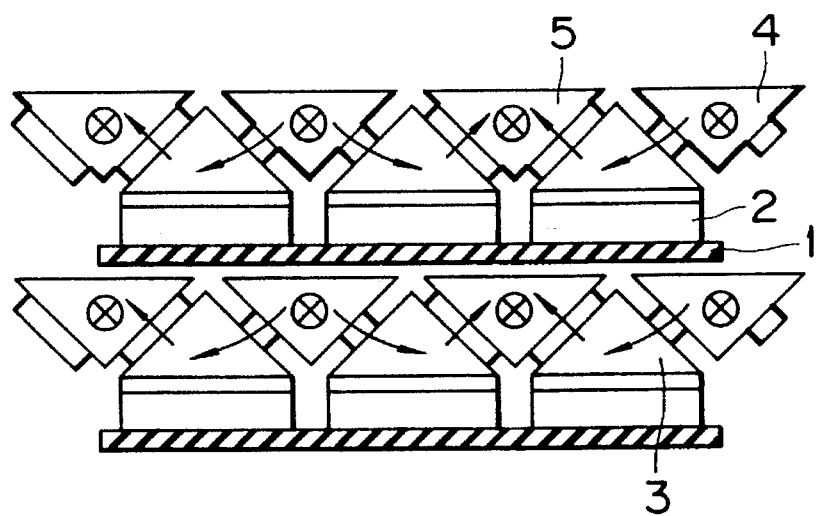
FIG. 9 is a detailed sectional view of an electronic equipment according to a third embodiment of the present invention as viewed from the bottom to the top of the equipment.

A third embodiment of the electronic equipment is shown in FIG. 9. FIG. 9 is a detailed sectional view of the electronic equipment as viewed from the bottom to the top of the equipment. In this embodiment, the semiconductor parts 2 are mounted on only one surface of the substrate 1, and in such a case, each of the air supply branched ducts 4 and the discharge branched ducts 5 has an inverted triangular section. However, advantages of this embodiment similar to those in the first embodiment can be obtained.

Figure 10:
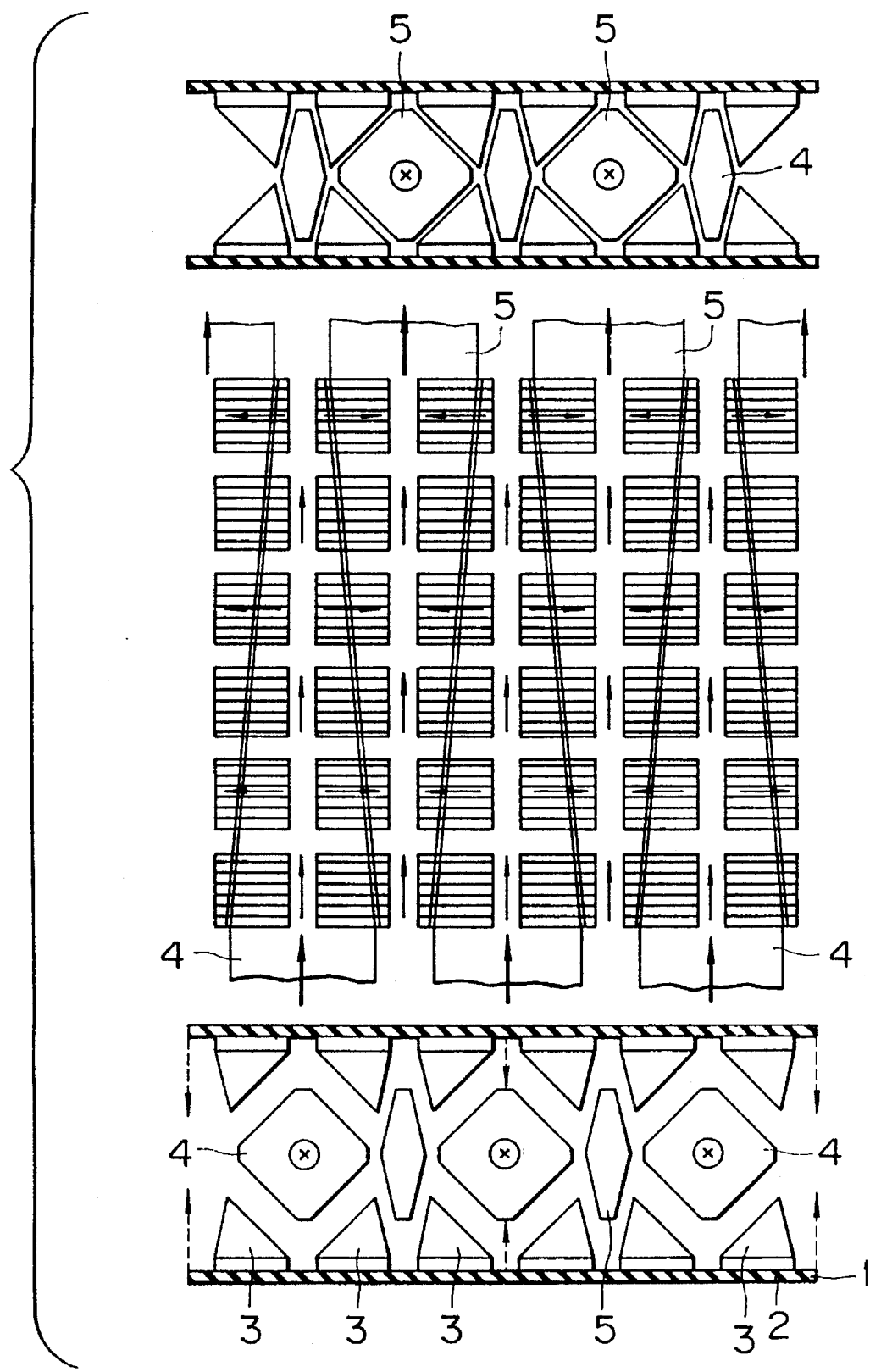
FIG. 10 is a view combining a sectional view of an electronic equipment according to a fourth embodiment as viewed from the side of the equipment with another sectional view of the same equipment as viewed from the bottom to the top of the equipment.

A fourth embodiment of the electronic equipment is shown in FIG. 10. FIG. 10 is a view combining a sectional view of the electronic equipment of this embodiment as viewed from the side of the equipment with sectional views of the same equipment as viewed from the bottom and the top thereof. In this embodiment, the air supply branched ducts 4 are constructed to be tapered in such a way that each sectional area of the ducts in a cross section vertically taken along the axis of the duct is reduced toward the downstream thereof in the air flowing direction. On the other hand, the air discharge branched ducts 5 are constructed to be diverged in such a way that each sectional area of the ducts in a cross section vertically taken along the axis of the duct is enlarged toward the downstream thereof in the air flowing direction. The apex of each of the triangular heat sinks 3 is displaced along the axis of the duct, along with the shape of the tapered supply ducts and that of the diverged discharge ducts. Since the electronic equipment is constructed as described above, the air flow velocity in the supply and discharge ducts can be uniform and the pressure loss in the ducts can thus be reduced. Also, the air flow can be uniformly distributed into the vertically-disposed heat sinks.

Figure 11:
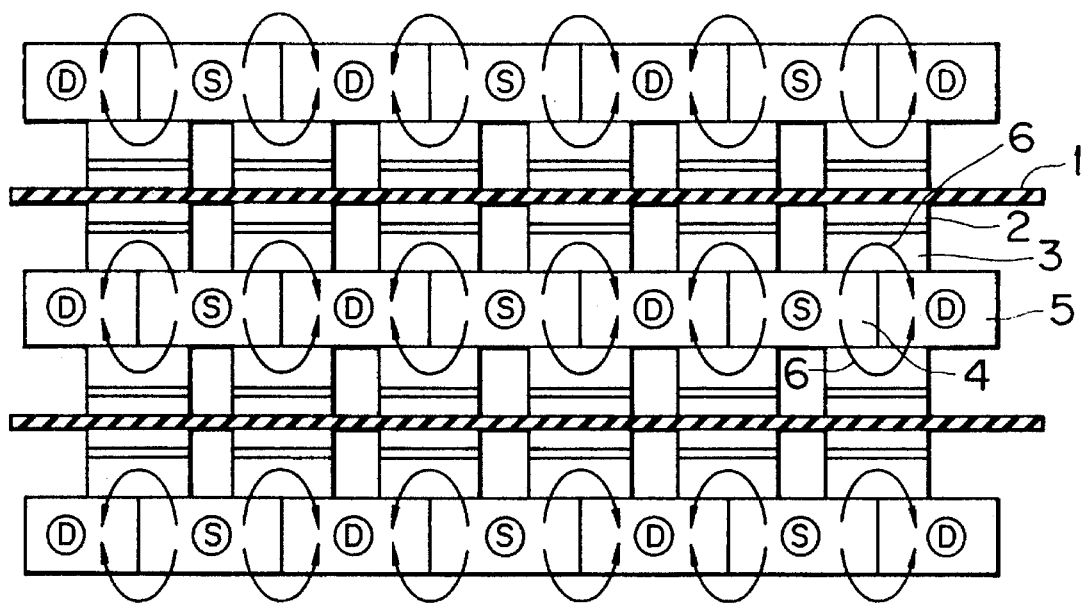
FIG. 11 is a sectional view of an electronic equipment according to a fifth embodiment of the present invention as viewed from the bottom to the top of the equipment.
Figure 12:
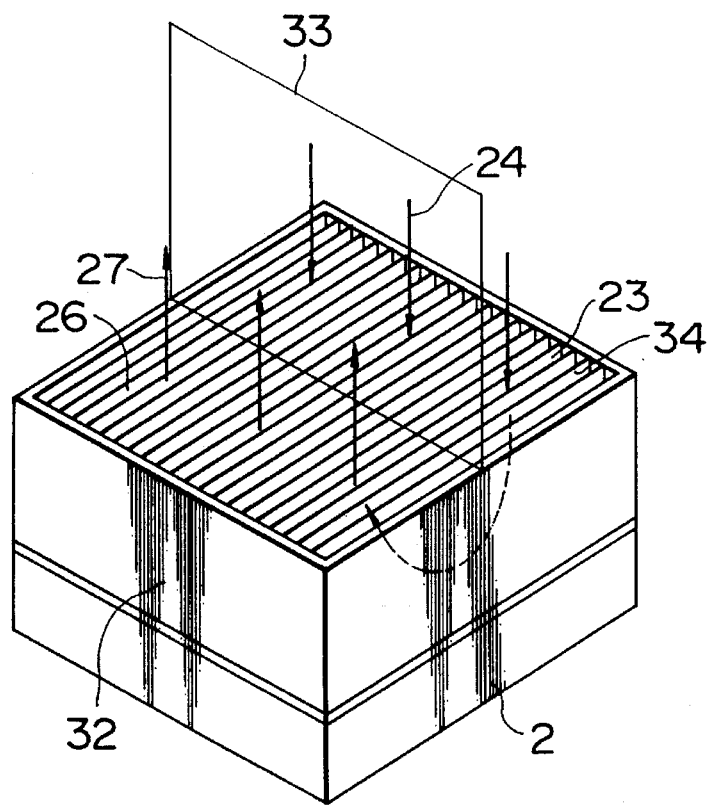
FIG. 12 is a detailed perspective view of a heat sink according to the fifth embodiment.
Figure 13:
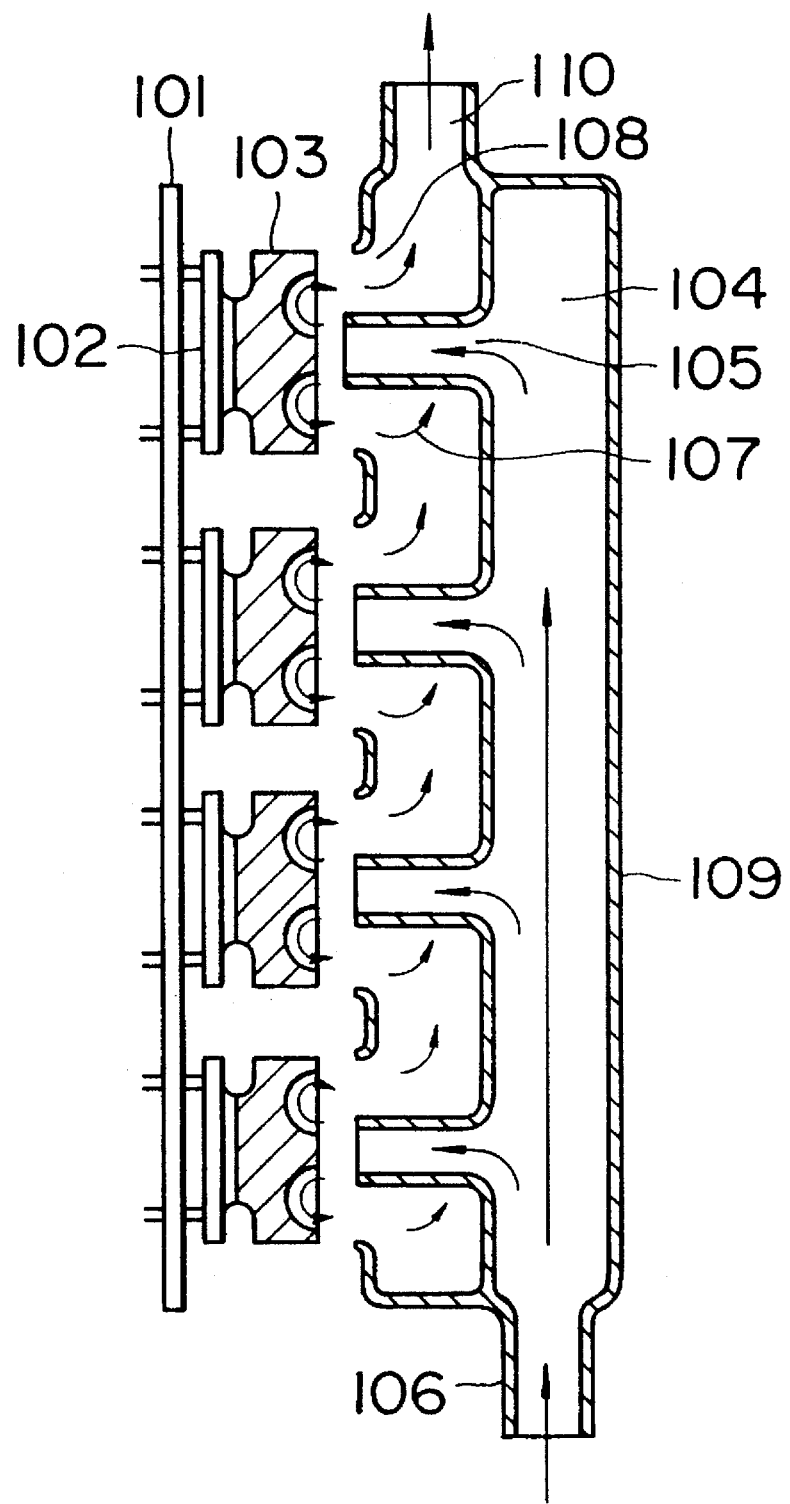
FIG. 13 is a sectional view of a conventional electronic equipment.

A fifth embodiment of the electronic equipment is shown in FIGS. 11 and 12. FIG. 11 is a sectional view of the electronic equipment of this embodiment as viewed from the bottom to the top of the equipment. FIG. 12 is a detailed perspective view of the heat sink of this embodiment. This embodiment is effective when gaps between a plurality of substrates 1 are relatively large, in which case, the air supply branched ducts 4 and the discharge branched ducts 5 are disposed only on the heat sinks 3. For example, large rectangular heat sinks shown in FIG. 11 can be accommodated in the relatively large gaps between the plurality of substrates 1. A space is also secured between the facing heat sinks 3, the supply and discharge ducts 4 and 5 being disposed alternately therein. As illustrated in FIG. 12, each of the rectangular heat sinks 3 comprises, for example, flat plate fins 34. Supply openings 23 and discharge openings 26 are arranged only on top of the flat plate fins 34. Partitions 32 of the heat sink 3 are disposed around the flat plate fins 34 in order to avoid the leakage of air. The supply openings 23 and the discharge openings 26 are separated by another partition 33 between the supply and discharge ducts. Since the electronic equipment is constructed as described above, in addition to the advantages obtained in the previous embodiments, cooling performance is advantageously improved because of the large heat sinks, and the supply and discharge ducts can be made larger, thus reducing the pressure loss. Further, since the air supply and discharge ducts can be built integrally with each .other, the number of parts can be decreased, thus reducing the number of processes.

As will be clearly understood from the foregoing description, the present invention offers the following advantages.

Since the air recovery openings of the refrigerant discharge ducts and the air discharge openings of the heat sinks are closely connected to each other, the discharged air from the heat sinks can be recovered without any leakage and discharged to the exterior of the equipment. Consequently, the cooling air can be employed for heat exchange without any waste, and also warming of the cooling air due to such leakage is prevented, thus avoiding an increase in the temperature of other semiconductor parts and further enabling uniform and highly-efficient air cooling. Also, a complicated air stream due to air leakage is not produced, thereby smoothly enhancing efficient air flowing and reducing flow loss.

Moreover, even if there is almost no space for accommodating the supply and discharge branched ducts above the heat sinks provided for the semiconductor parts mounted on the substrate, both ducts can be disposed alternately in the gaps between the heat sinks. Hence, even when a plurality of substrates are provided very closely parallel to each other three-dimensionally, the air cooling can be realized in high efficiency.

What is claimed is:

1. An electronic equipment assembly, comprising a plurality of substrates, each substrate having two substantially planar surfaces; a plurality of heat-emitting semi-conductor parts mounted on each surface of each of said substrates, said plurality of substrates being stacked to form a high-heat emitting portion; a plurality of heat sinks, each heat sink having a triangular cross section, one heat sink in thermal contact with each of said semiconductor parts, said triangular heat sinks positioned to define a plurality of spaces therebetween; and a plurality of refrigerant supply branched ducts and refrigerant discharge branched ducts arranged alternatively in said spaces defined by said heat sinks.

2. An electronic equipment assembly according to claim 1, wherein at least one of said refrigerant supply branched ducts and at least one of said refrigerant discharge branched ducts are disposed substantially in the same plane and parallel to said substrates.

3. An electronic equipment assembly according to claim 1, wherein said refrigerant supply branched ducts include a plurality of supply openings through which gas refrigerant is supplied to said plurality of heat sinks, said supply openings being disposed in a cross section perpendicular to the axis of said refrigerant supply branched duct.

4. An electronic equipment assembly according to claim 3, wherein said refrigerant discharge branched ducts include a plurality of discharge openings through which gas refrigerant is recovered from said plurality of heat sinks, said discharge openings being disposed in a cross section perpendicular to the axis of said refrigerant discharge branched duct.

5. An electronic equipment assembly according to claim 4, wherein said refrigerant supply branched duct includes an ejection opening for the refrigerant formed in a position corresponding to said heat sinks, said ejection opening being closely connected to said supply openings for the refrigerant provided for said heat sink, and wherein said refrigerant discharge branched duct includes a recovery opening for the refrigerant disposed in a position corresponding to said heat sinks, said recovery opening being closely connected to said discharge openings for the gas refrigerant provided for said heat sink.

6. An electronic equipment assembly according to claim 1, wherein said refrigerant discharge branched ducts include a plurality of discharge openings through which gas refrigerant is recovered from said plurality of heat sinks, said discharge openings being disposed in a cross section perpendicular to the axis of said refrigerant discharge branched duct.

7. An electronic equipment assembly as claimed in claim 1, wherein said substrates are stacked substantially parallel to each other, wherein each of said spaces comprises a quadrilateral space defined by two adjacent semiconductor parts mounted on a surface of one of said substrates and another two adjacent semiconductor parts mounted on a surface of another of said substrates facing said one substrate, and wherein the refrigerant supply branched duct provided in said quadrilateral space simultaneously supplies gas refrigerant to said four semiconductor parts.

8. An electronic equipment assembly as claimed in claim 1, wherein said substrates are stacked substantially parallel to each other, wherein each of said spaces comprises a quadrilateral space defined by two adjacent semiconductor parts mounted on a surface of one of said substrates and another two adjacent semiconductor parts mounted on a surface of another of said substrates facing said one substrate, and wherein the refrigerant discharge branched duct provided in said quadrilateral space simultaneously receives gas refrigerant from said four semiconductor parts.

9. An electronic equipment according to claim 8, wherein each refrigerant supply branched duct simultaneously supplies gas refrigerant to the four semiconductor parts defining the associated quadrilateral space, and wherein said refrigerant supply branched ducts and said refrigerant discharge branched ducts are alternately disposed between two of said substrates.

10. An electronic equipment assembly, comprising a plurality of substrates, each substrate having mounted thereon a plurality of heat-emitting semiconductor parts, said plurality of substrates being stacked to form a high-heat emitting portion; a plurality of heat sinks, each heat sink having a triangular cross section, one heat sink in thermal contact with each of said semiconductor parts, said triangular heat sinks positioned to define with said substrates a plurality of spaces therebetween; and a plurality of refrigerant supply branched ducts and refrigerant discharge branched ducts arranged alternately in said spaces defined by said heat sinks and said substrates.

* * * * *